US012699145B2

(12) United States Patent     (10) Patent No.:   US 12,699,145 B2
Koshii     (45) Date of Patent:     Aug. 4, 2026

(54) FULL CHARGE CAPACITY MEASURING DEVICE

(71) Applicant: TOYOTA JIDOSHA KABUSHIKI KAISHA, Toyota (JP)

(72) Inventor: Takaya Koshii, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 400 days.

(21) Appl. No.: 18/464,476

(22) Filed: Sep. 11, 2023

(65) Prior Publication Data

US 2024/0175931 A1     May 30, 2024

(30) Foreign Application Priority Data

Nov. 28, 2022    (JP) ................................ 2022-189447

(51) Int. Cl.
*G01R 31/388*     (2019.01)
*B60L 58/12*     (2019.01)
*B60L 58/20*     (2019.01)
*H01M 10/625*     (2014.01)

(52) U.S. Cl.
CPC ............ *G01R 31/388* (2019.01); *B60L 58/12* (2019.02); *B60L 58/20* (2019.02); *B60L 2240/545* (2013.01); *H01M 10/625* (2015.04); *Y02E 60/10* (2013.01)

(58) Field of Classification Search
CPC ....... G01R 31/388; B60L 58/12; B60L 58/20; B60L 2240/545; Y02E 60/10; H01M 10/625
See application file for complete search history.

(56) References Cited

U.S. PATENT DOCUMENTS

| | | | | |
|---|---|---|---|---|
| 2016/0236581 A1* | 8/2016 | Tashiro | ...................... | B60L 7/14 |
| 2018/0281618 A1* | 10/2018 | Ogaki | ................... | H01M 10/44 |
| 2020/0298888 A1* | 9/2020 | Ozeki | ................. | H01M 10/443 |
| 2021/0242699 A1* | 8/2021 | Shimizu | ................ | H02J 7/0049 |

FOREIGN PATENT DOCUMENTS

| | | | | | |
|---|---|---|---|---|---|
| CN | 111055698 A | * | 4/2020 | ........ | H01M 8/04373 |
| JP | 2015-083928 A | | 4/2015 | | |
| JP | 2021-090275 A | | 6/2021 | | |

* cited by examiner

*Primary Examiner* — Christian T Bryant
(74) *Attorney, Agent, or Firm* — SoraIP, Inc.

(57)     ABSTRACT

The full charge capacity measuring device is a full charge capacity measuring device that measures a full charge capacity of a sub-battery provided for backup of a main battery that supplies electric power to an automatic operation system. The full charge capacity measuring device includes an acquisition unit that acquires a temperature of the sub-battery, a determination unit that determines whether or not the current temperature of the sub-battery is less than a lower limit temperature at which the automatic operation system can operate, and a measurement control unit that performs measurement control of the full charge capacity of the sub-battery when the current temperature is less than the lower limit temperature.

2 Claims, 4 Drawing Sheets

FULL CHARGE CAPACITY MEASURING DEVICE

CROSS-REFERENCE TO RELATED APPLICATION

This application claims priority to Japanese Patent Application No. 2022-189447 filed on Nov. 28, 2022, incorporated herein by reference in its entirety.

BACKGROUND

1. Technical Field

The present disclosure relates to a device for measuring a full charge capacity of a battery.

2. Description of Related Art

Japanese Unexamined Patent Application Publication No. 2015-083928 (JP 2015-083928 A) discloses a full charge capacity calculation device for calculating a full charge capacity of a battery, based on a charge and discharge amount of the battery during one trip from when a start switch of a vehicle is turned on until the start switch is turned off.

SUMMARY

The storage rate (State Of Charge (SOC)) of a sub-battery provided for backup of a main battery needs to be kept high at all times in preparation for a failure of the main battery. Therefore, a method of measuring the full charge capacity by temporarily performing discharge until the storage rate reaches a predetermined low storage rate (low SOC) and then performing recharge until a predetermined high storage rate (high SOC) is reached, cannot be easily applied to the sub-battery.

The present disclosure has been made in view of the above issue, and an object of the present disclosure is to provide a full charge capacity measuring device capable of measuring a full charge capacity of a sub-battery while maintaining a storage rate needed for backup power supply of a system.

In order to solve the above issue, an aspect of a technique of the present disclosure is a full charge capacity measuring device that measures a full charge capacity of a sub-battery, the sub-battery being provided for backup of a main battery that supplies electric power to an autonomous driving system. The full charge capacity measuring device includes: an acquisition unit that acquires a temperature of the sub-battery; a determination unit that determines whether a current temperature of the sub-battery is lower than a lower limit temperature at which the autonomous driving system is able to operate; and a measurement control unit that performs measurement control of the full charge capacity of the sub-battery when the current temperature is lower than the lower limit temperature.

With the full charge capacity measuring device according to the present disclosure described above, since the measurement control of the full charge capacity of the sub-battery is performed only when the temperature of the battery is low at which the autonomous driving system does not operate, it is possible to measure the full charge capacity of the sub-battery while maintaining the storage rate needed for the backup power supply of a system other than the autonomous driving system.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

The full charge capacity measuring device of the present disclosure performs measurement control of the full charge capacity of the sub-battery at a low temperature of the sub-battery in which the automatic operation system in which the backup power supply to the automatic operation system does not occur does not operate. This makes it possible to maintain the power storage rate necessary for backup power supply of the system and to measure the full charge capacity of the sub-battery.

Hereinafter, an embodiment of the present disclosure will be described in detail with reference to the drawings.

Embodiment

Configuration

Figure 1:
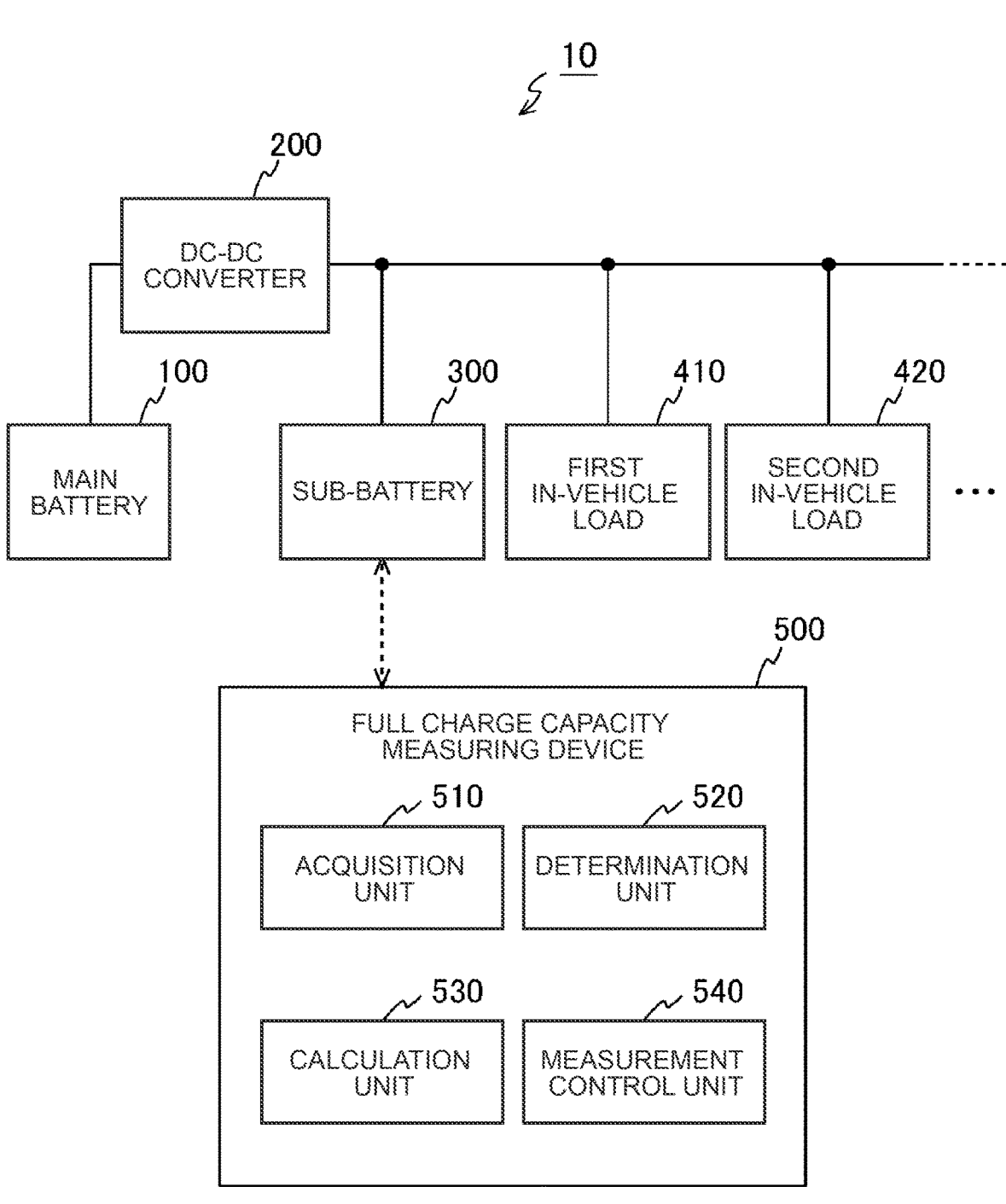
FIG. 1 is a functional block diagram of a power supply system including a full charge capacity measuring device according to an embodiment of the present disclosure and a peripheral portion thereof.

FIG. 1 is a functional block diagram of a power supply system 10 including a full charge capacity measuring device 500 and a peripheral portion thereof according to an embodiment of the present disclosure. The power supply system 10 illustrated in FIG. 1 includes a main battery 100, a direct current (DC)-DC converter 200, a sub-battery 300, and a full charge capacity measuring device 500. In FIG. 1, a connection line through which electric power flows is indicated by a solid line, and a connection line through which a detection signal, a control signal, or the like flows is indicated by a dotted line.

The power supply system 10 illustrated in FIG. 1 is mounted on a vehicle or the like in which an automated driving system is mounted. In the following embodiments, the control of the full charge capacity measuring device 500 according to the present embodiment will be described by exemplifying cases where the power supply system 10 is mounted on vehicles such as hybrid electric vehicle (HEV), plug-in hybrid electric vehicle (PHEV), and battery electric vehicle (BEV) that use an electric motor as a power source.

The main battery 100 is a secondary battery configured to be chargeable and dischargeable, and is, for example, a lead storage battery. The main battery 100 is connected to DC-DC converter 200, and supplies the electric power stored therein to the sub-battery 300, the first in-vehicle load 410, and the second in-vehicle load 420 via DC-DC converter 200. The main battery 100 functions as a main battery that supplies power to the first in-vehicle load 410 and the second in-vehicle load 420 in a normal state in which no abnormality such as a power failure has occurred.

DC-DC converter 200 is a power converter that connects the main battery 100, the sub-battery 300, the first in-vehicle load 410, and the second in-vehicle load 420, and supplies the electric power of the main battery 100 to the sub-battery 300, the first in-vehicle load 410, and the second in-vehicle load 420. When power is supplied, DC-DC converter 200 may convert the voltage of the main battery 100, which is an inputted voltage, into a predetermined voltage and output the converted voltage.

The sub-battery 300 is a secondary battery configured to be chargeable and dischargeable, and is, for example, an iron phosphate-based lithium-ion battery (LFP battery). The sub-battery 300 is connected to DC-DC converter 200, the first in-vehicle load 410, and the second in-vehicle load 420, and supplies the electric power stored therein to the first in-vehicle load 410 and the second in-vehicle load 420, and charges the electric power outputted from the main battery 100 via DC-DC converter 200. The sub-battery 300 functions as a sub-battery that backs up and supplies power to the first in-vehicle load 410 and the second in-vehicle load 420 in an emergency where an abnormality such as a failure of the main battery 100 occurs.

The first in-vehicle load 410 and the second in-vehicle load 420 have configurations such as an Electronic Control Unit (ECU) mounted on a vehicle and a system. The first in-vehicle load 410 in the present embodiment is a load that requires a redundant power supply only in a situation where the vehicle is performing automatic driving. Examples of the first in-vehicle loads 410 include ECU such as electric power steering (EPS) and advanced driving assistance (ADAS). The second in-vehicle load 420 in the present embodiment is a load that requires a redundant power supply not only in a scene in which the vehicle is performing automatic driving but also in a scene in which manual driving is performed by a driver. Examples of the second in-vehicle loads 420 include ECU such as shift-by-wire (SBW) and electric braking (EBK). The vehicle may be equipped with not only the first in-vehicle load 410 and the second in-vehicle load 420 illustrated in FIG. 1, but also a load that does not require a redundant power supply.

The full charge capacity measuring device 500 is a configuration for measuring the full charge capacity of the sub-battery 300. The full charge capacity measuring device 500 includes an acquisition unit 510, a determination unit 520, a calculation unit 530, and a measurement control unit 540.

The acquisition unit 510 acquires the temperature of the sub-battery 300. The temperature of the sub-battery 300 can be acquired through a detection element (not shown) such as a temperature sensor provided in the sub-battery 300, for example.

The determination unit 520 compares the current temperature of the sub-battery 300 acquired by the acquisition unit 510 with the lower limit temperature at which the automatic driving system mounted in the vehicle can operate, and determines whether the current temperature is lower than the lower limit temperature. The lower limit temperature is the lowest temperature required for the sub-battery 300 when the automatic operation system executes the automatic operation function, and is defined in advance.

The calculation unit 530 calculates various values related to the sub-battery 300. Specifically, the calculation unit 530 calculates a temperature difference between the current temperature of the sub-battery 300 and the lower limit temperature at which the automatic operation system can operate. Further, the calculation unit 530 calculates a charge/ discharge value that can be output by the sub-battery 300 at the current temperature based on the current temperature of the sub-battery 300. Further, the calculation unit 530 calculates a time (estimated value) required for the completion of the full charge capacity measurement process of the sub-battery 300 by the measurement control unit 540, based on the charge/discharge value that can be output by the sub-battery 300 at the current temperature. Further, the calculation unit 530 calculates a time (estimated value) required for the temperature of the sub-battery 300 to rise to the temperature of the lower limit at which the automatic operation system can operate, based on the temperature difference between the current temperature of the sub-battery 300 and the temperature of the lower limit at which the automatic operation system can operate and the charge/discharge value that the sub-battery 300 can output at the current temperature.

The measurement control unit 540 is a configuration for controlling the full charge capacity measurement process of the sub-battery 300. The measurement control unit 540 measures the full charge capacity of the sub-battery 300 when the current temperature of the sub-battery 300 is a low temperature at which the automatic operation system does not operate. In order to measure the full charge capacity of the sub-battery 300, a well-known technique can be used in which the power storage rate is temporarily discharged to a predetermined low State Of Charge (low SOC) and then measured and estimated based on data obtained by charging again until a predetermined high SOC is reached.

Note that some or all of the above-described full charge capacity measuring device 500 may typically be configured as an electronic control unit including a processor, a memory, an input/output interface, and the like. The electronic control unit realizes all or a part of the functions performed by the acquisition unit 510, the determination unit 520, the calculation unit 530, and the measurement control unit 540 by the processor reading and executing the program stored in the memory.

Control

Figure 2A:
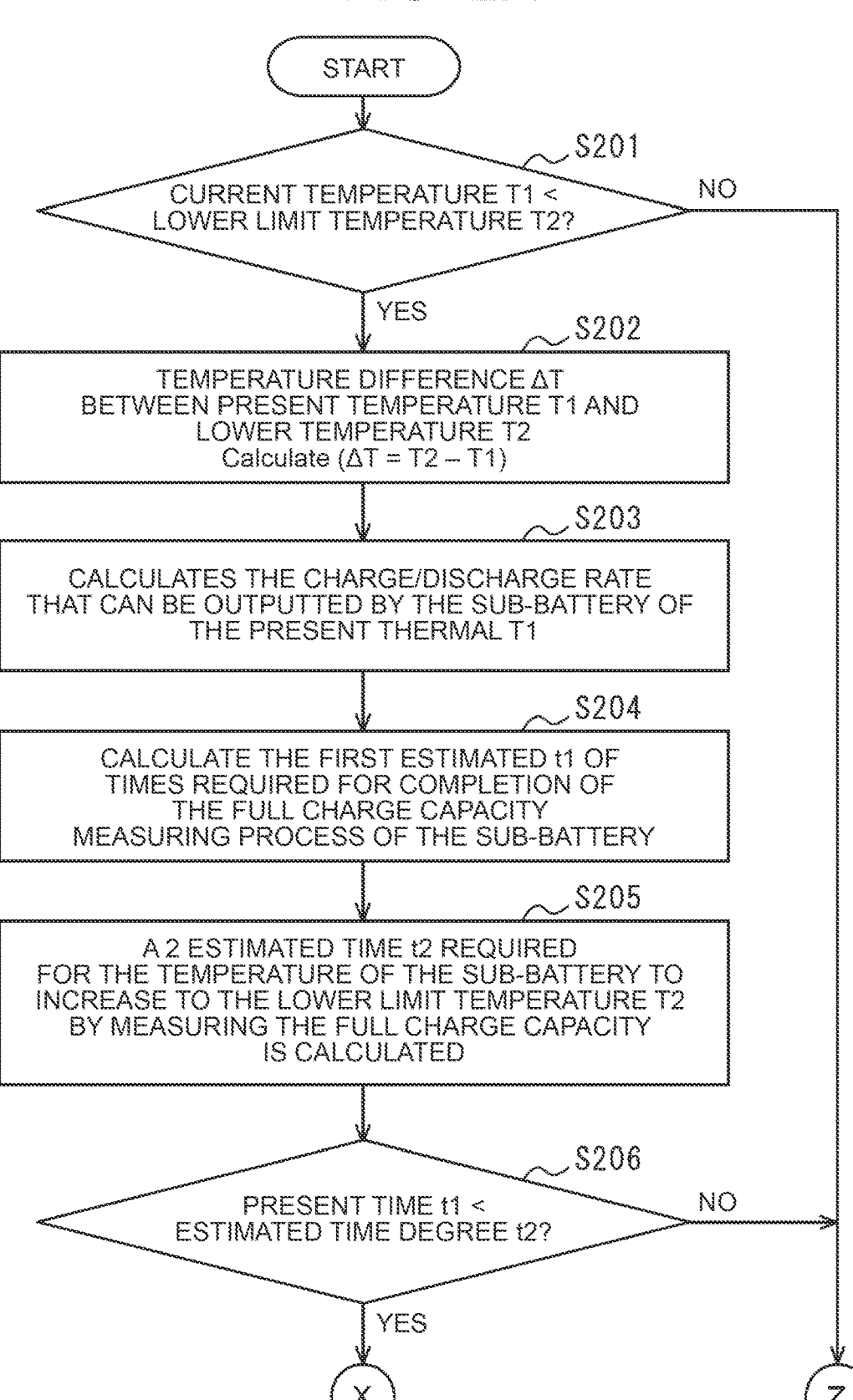
FIG. 2A is a diagram illustrating a process flow chart of a full charge capacity measurement control of a sub-battery performed by a full charge capacity measuring device.
Figure 2B:
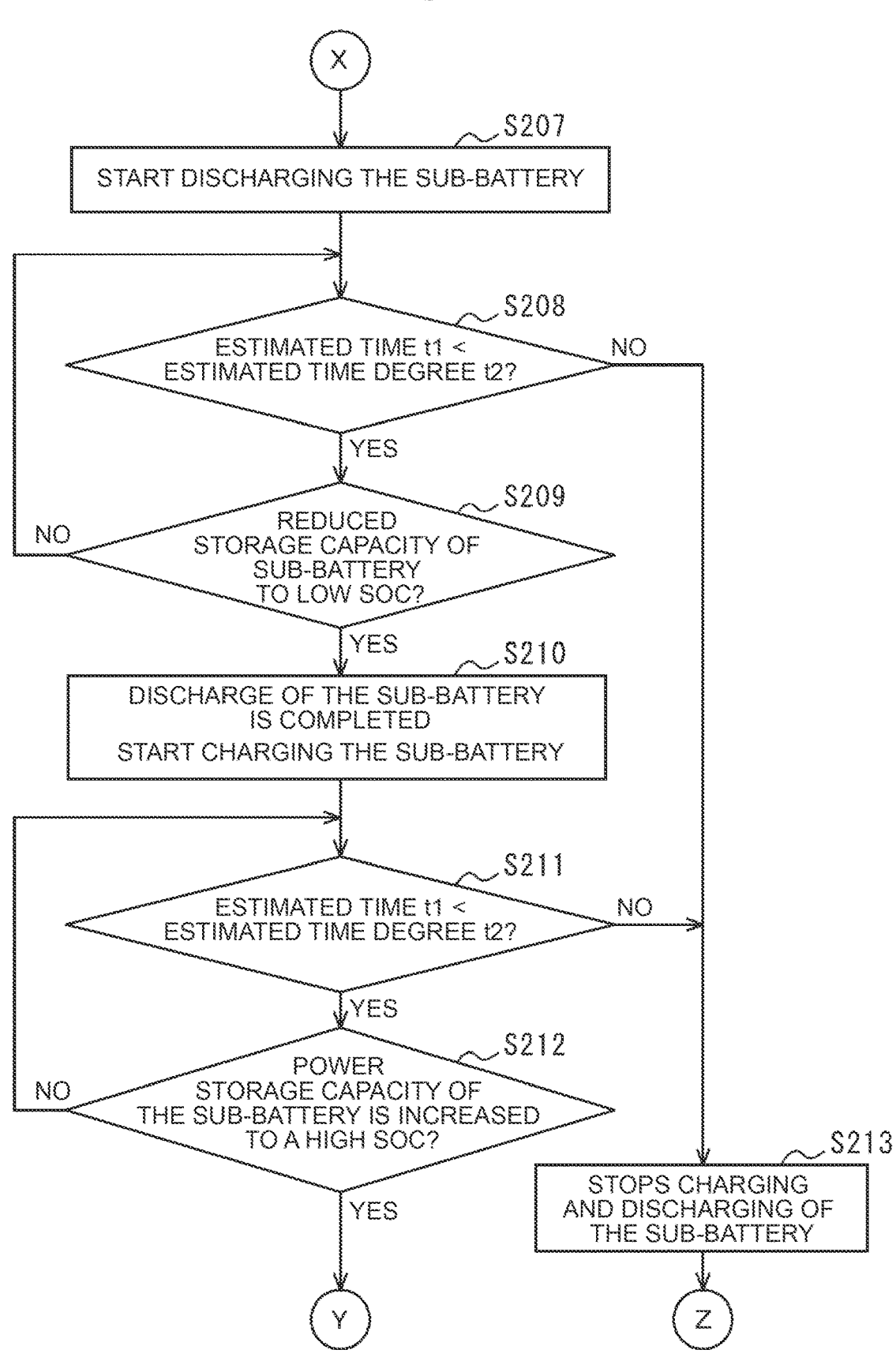
FIG. 2B is a diagram illustrating a process flow chart of a full charge capacity measurement control of a sub-battery performed by a full charge capacity measuring device.
Figure 2C:
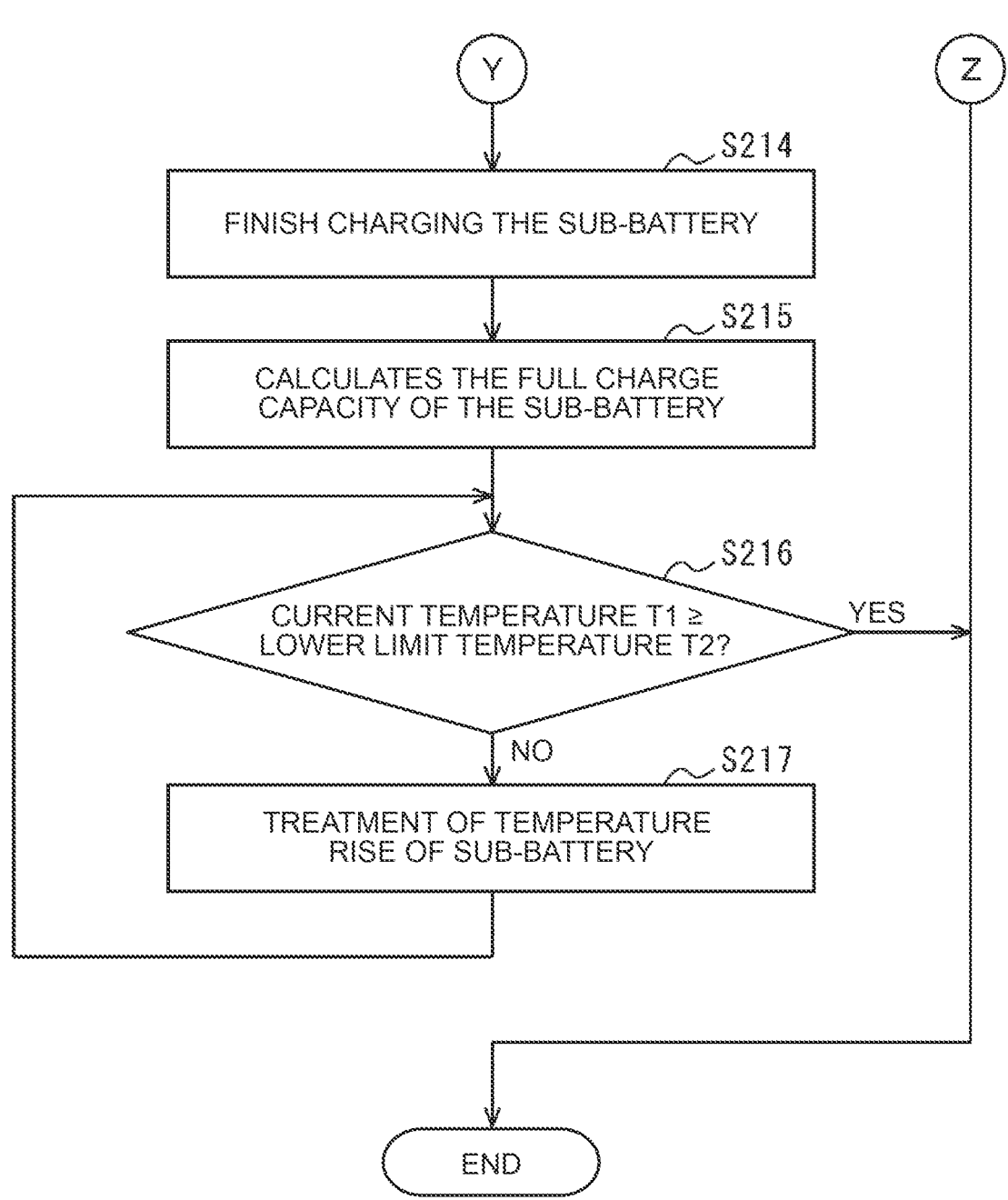
FIG. 2C is a diagram illustrating a process flow chart of full charge capacity measurement control of a sub-battery performed by a full charge capacity measuring device.

Next, the control performed by the full charge capacity measuring device 500 according to an embodiment of the present disclosure will be described with reference to FIG. 2A, FIG. 2B, and FIG. 2C. FIG. 2A, FIG. 2B, and FIG. 2C are flow charts illustrating a process sequence of full charge capacity measurement control of a sub-battery 300 executed by the full charge capacity measuring device 500. The process of FIG. 2A, the process of FIG. 2B, and the process of FIG. 2C are connected by the couplers X, Y, and Z, respectively. The full charge capacity measurement control of the sub-battery 300 is started by, for example, requiring the full charge capacity measuring device 500 to measure the full charge capacity of the sub-battery 300.

S201

The determination unit 520 of the full charge capacity measuring device 500 determines whether or not the present temperature T1 [° C.] of the sub-battery 300 acquired by the acquisition unit 510 is lower than a lower limit temperature T2 [° C.] at which a predefined automated driving system can operate. By this determination, it is possible to grasp whether or not the sub-battery 300 needs to prepare backup power for automatic operation.

When the determination unit 520 determines that the present temperature T1 is less than the lower limit temperature T2 (T1<T2) (S201, Yes), the process proceeds to S202. On the other hand, when the determination unit 520 determines that the present temperature T1 is equal to or higher than the lower limit temperature T2 (T1≥T2) (S201, no), the power storage rate of the sub-battery 300 cannot be lowered, and thus the full charge capacity measuring control of the sub-battery 300 ends.

S202

The calculation unit 530 of the full charge capacity measuring device 500 calculates a temperature difference $\Delta T$ [° C.], which is a difference between the present temperature T1 of the sub-battery 300 and the lower limit temperature T2 at which the autonomous operation system can operate ($\Delta T = T2 - T1$). When the calculation unit 530 calculates the temperature difference $\Delta T$ between the present temperature T1 and the lower limit temperature T2, the process proceeds to S203.

S203

The calculation unit 530 of the full charge capacity measuring device 500 calculates a charge/discharge rate that can be outputted by the sub-battery 300 in the present temperature T1. The charge/discharge value that can be output from the sub-battery 300 is a value obtained by summing the discharge value that is the power output from the sub-battery 300 to the main battery 100 via DC-DC converter 200 (which may include the power output from the sub-battery 300 to the first in-vehicle load 410 and the second in-vehicle load 420) and the charge value that is the power input from the main battery 100 to the sub-battery 300 via DC-DC converter 200. When the calculation unit 530 calculates a charge/discharge rate at which the sub-battery 300 of the present temperature T1 can be outputted, the process proceeds to S204.

S204

The calculation unit 530 of the full charge capacity measuring device 500 calculates a first estimated time t1 [second], which is a time estimated to be taken until the measurement process of the full charge capacity of the sub-battery 300 is completed, based on the charge/discharge value that the sub-battery 300 of the present temperature T1 can output. The first estimated time t1 includes at least a time for discharging the sub-battery 300 from the present storage rate (current SOC) to a predetermined low storage rate (low SOC) with the calculated discharge value, and a time for charging the sub-battery 300 from a low SOC to a predetermined high storage rate (high SOC) with the calculated charge value. When the calculation unit 530 calculates the first estimated t1 until the full charge capacity measuring process of the sub-battery 300 is completed, the process proceeds to S205.

S205

The calculation unit 530 of the full charge capacity measuring device 500 calculates a second estimated time t2 [second], which is a time estimated to be taken for the temperature of the sub-battery 300 to rise from the present temperature T1 to the lower limit temperature T2 due to the heat generation of the sub-battery 300 caused by the measurement process of the full charge capacity of the sub-battery 300. When the calculation unit 530 calculates the second estimated time t2 until the temperature of the sub-battery 300 rises from the present temperature T1 to the lower limit temperature T2, the process proceeds to S206.

S206

The measurement control unit 540 of the full charge capacity measuring device 500 determines whether or not the first estimated time t1 calculated by the calculation unit 530 until the measurement process of the full charge capacity of the sub-battery 300 is completed is shorter than the second estimated time t2 required for the temperature of the sub-battery 300 to rise from the present temperature T1 to the lower limit temperature T2. By this determination, it is possible to grasp whether or not there is a possibility that the automatic operation operates in the middle of the full charge capacity measurement process.

When the measurement control unit 540 determines that the first estimated time t1 is shorter than the second estimated time t2 (t1<t2) (S206, Yes), the process proceeds to S207. On the other hand, when the measurement control unit 540 determines that the first estimated time t1 is longer (t1≥t2) than the second estimated time t2 (S206, No), the power storage rate of the sub-battery 300 cannot be lowered, and thus the full-charge-capacity measurement control of the sub-battery 300 ends.

S207

The measurement control unit 540 of the full charge capacity measuring device 500 starts a discharge process of discharging the electric power of the sub-battery 300 to reduce the power storage rate. This discharging process is preferably performed by power transfer from the sub-battery 300 to the main battery 100. When the measurement control unit 540 starts the discharging process of the sub-battery 300, the process proceeds to S208.

S208

The measurement control unit 540 of the full charge capacity measuring device 500 determines again whether or not the first estimated time t1 until the measurement process of the full charge capacity of the sub-battery 300 is completed is shorter than the second estimated time t2 required for the temperature of the sub-battery 300 to rise from the present temperature T1 to the lower limit temperature T2.

When the measurement control unit 540 determines that the first estimated time t1 is shorter than the second estimated time t2 (t1<t2) (S208, Yes), the process proceeds to S209. On the other hand, when the measurement control unit 540 determines that the first estimated time t1 is longer than the second estimated time t2 (t1≥t2) (S208, No), the process proceeds to S213.

S209

The measurement control unit 540 of the full charge capacity measuring device 500 determines whether or not the power storage rate of the sub-battery 300 has decreased to a predetermined low storage rate (low SOC). The low SOC can be determined in advance according to the performance, the capacity, and the like of the sub-battery 300.

When the measurement control unit 540 determines that the storage rate of the sub-battery 300 has decreased to a low SOC (S209, Yes), the process proceeds to S210. On the other hand, when the measurement control unit 540 determines that the storage rate of the sub-battery 300 has not yet decreased to a low SOC (S209, No), the process proceeds to S208.

S210

The measurement control unit 540 of the full charge capacity measuring device 500 ends the discharging process of discharging the electric power of the sub-battery 300 to reduce the electric storage rate, and starts the charging process of supplying the electric power to the sub-battery 300 to increase the electric storage rate. This charging process is typically performed by power transfer from the main battery 100 to the sub-battery 300. When the measurement control unit 540 ends the discharging process of the sub-battery 300 and starts the charging process of the sub-battery 300, the process proceeds to S211.

S211

The measurement control unit 540 of the full charge capacity measuring device 500 determines again whether or not the first estimated time t1 until the measurement process of the full charge capacity of the sub-battery 300 is completed is shorter than the second estimated time t2 required for the temperature of the sub-battery 300 to rise from the present temperature T1 to the lower limit temperature T2.

When the measurement control unit 540 determines that the first estimated time t1 is shorter than the second estimated time t2 (t1<t2) (S211, Yes), the process proceeds to S212. On the other hand, when the measurement control unit 540 determines that the first estimated time t1 is longer than the second estimated time t2 (t1≥t2) (S211, No), the process proceeds to S213.

S212

The measurement control unit 540 of the full charge capacity measuring device 500 determines whether or not the storage rate of the sub-battery 300 has increased to a predetermined high storage rate (high SOC). The high SOC can be determined in advance according to the performance, the capacity, and the like of the sub-battery 300.

When the measurement control unit 540 determines that the storage rate of the sub-battery 300 has increased to a high SOC (S212, Yes), the process proceeds to S213. On the other hand, when the measurement control unit 540 determines that the storage rate of the sub-battery 300 has not yet increased to the high SOC (S212, No), the process proceeds to S211.

S213

The measurement control unit 540 of the full charge capacity measuring device 500 stops the discharging process of the sub-battery 300 or the charging process of the sub-battery 300 that is being performed. As a result, the full charge capacity measurement control of the sub-battery 300 ends.

S214

The measurement control unit 540 of the full charge capacity measuring device 500 ends the charging process of supplying electric power to the sub-battery 300 to increase the power storage rate. When the measurement control unit 540 finishes the charging process of the sub-battery 300, the process proceeds to S215.

S215

The measurement control unit 540 of the full charge capacity measuring device 500 calculates the full charge capacity of the sub-battery 300 based on the data obtained by the discharging process and the charging process of the sub-battery 300. Specifically, the full charge capacity FCC [Ah] of the sub-battery 300 can be derived by the following equation based on the storage rate SOC_V1 [%] calculated from the open circuit voltage V1 and the storage rate SOC_V2 [%] calculated from the open circuit voltage V2 when the charge amount C [Ah] is charged from the open circuit voltage V1 to the open circuit voltage V2 (V1<V2). When the measurement control unit 540 calculates the full charge capacity of the sub-battery 300, the process proceeds to S216.

$$FCC = C \times 100/(SOC\_V2 - SOC\_V1)$$

S216

The determination unit 520 of the full charge capacity measuring device 500 determines whether or not the present temperature T1 of the sub-battery 300 is equal to or higher than a lower limit temperature T2 at which the autonomous driving system can operate. By this determination, it is possible to grasp whether or not the sub-battery 300 is ready for backup power for automatic operation.

When the determination unit 520 determines that the present temperature T1 is less than the lower limit temperature T2 (T1<T2) (S216, No), the process proceeds to S217. On the other hand, when the determination unit 520 determines that the present temperature T1 is equal to or higher than the lower limit temperature T2 (T1≥T2) (S216, Yes), it is determined that the sub-battery 300 is ready to output the backup power for the automated operation, and the full charge capacity measuring control of the sub-battery 300 is ended.

S217

The measurement control unit 540 of the full charge capacity measuring device 500 performs a temperature raising process of the sub-battery 300. The temperature raising process is, for example, a process of raising the temperature of the sub-battery 300 by discharging or charging the sub-battery 300 while maintaining the power storage rate of the sub-battery 300 in the vicinity of the high SOC to generate heat in the sub-battery 300. When the temperature-raising process of the sub-battery 300 is performed by the measurement control unit 540, the process proceeds to S216.

Operations and Effects

As described above, according to the full charge capacity measuring device 500 according to the embodiment of the present disclosure, the sub-battery 300 provided for backup of the main battery 100 that supplies electric power to the load (the first in-vehicle load 410 and the second in-vehicle load 420) including the automatic operation system performs the measurement control of the full charge capacity when the temperature of the sub-battery 300 is at a low temperature at which the operation of the automatic operation system does not occur.

By such control, it is possible to measure the full charge capacity of the sub-battery 300 while maintaining the power storage rate necessary for backup power supply of a system other than the automatic operation system.

Although an embodiment of the present disclosure has been described above, the present disclosure can be regarded as not only the above-described full charge capacity measuring device but also a control method executed by the full charge capacity measuring device including a processor and a memory, a control program of the control method, a non-transitory computer-readable recording medium storing the control program, or a vehicle equipped with the full charge capacity measuring device.

The full charge capacity measuring device of the present disclosure can be used for measuring a full charge capacity of a battery, for example.

What is claimed is:

1. A power supply system comprising:
   a main battery configured to supply electric power to an autonomous driving system;
   a sub-battery configured to be provided for backup of the main battery;
   a converter configured to supply the electric power from the main battery to the sub-battery; and
   a full charge capacity measuring device configured to measure a full charge capacity of the sub-battery, the full charge capacity measuring device including a processor, wherein
   the processor is configured to:
   acquire a temperature of the sub-battery;
   determine whether a current temperature of the sub-battery is lower than a lowest temperature at which the autonomous driving system is operable; and
   perform measurement control of the full charge capacity of the sub-battery in a case where the current temperature is lower than the lowest temperature, and the converter is further configured to perform charging of the sub-battery until the temperature of the sub-battery reaches the lowest temperature, after the measurement of the full charge capacity of the sub-battery is completed.

2. The power supply system according to claim 1, wherein the processor is further configured to calculate a first estimated time and a second estimated time, the first estimated time being a time taken for a measurement of the full charge capacity of the sub-battery to be completed with a charge and discharge value that is outputtable by the sub-battery at the current temperature, and the second estimated time being a time taken for the temperature of the sub-battery to increase from the current temperature to the lowest temperature by performing the measurement control of the full charge capacity, and measure the full charge capacity of the sub-battery in a case where the first estimated time is less than the second estimated time.

\* \* \* \* \*